(12) United States Patent
Huang

(10) Patent No.: US 11,094,893 B2
(45) Date of Patent: Aug. 17, 2021

(54) FLEXIBLE COVER PLATE OF DISPLAY PANEL

(71) Applicant: Wuhan China Star Optoelectronics Semiconductor Display Technology Co., Ltd., Hubei (CN)

(72) Inventor: Cui Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 502 days.

(21) Appl. No.: 16/080,057

(22) PCT Filed: Jun. 21, 2018

(86) PCT No.: PCT/CN2018/092221
§ 371 (c)(1),
(2) Date: Aug. 27, 2018

(87) PCT Pub. No.: WO2019/205266
PCT Pub. Date: Oct. 31, 2019

(65) Prior Publication Data
US 2021/0119155 A1    Apr. 22, 2021

(30) Foreign Application Priority Data
Apr. 28, 2018 (CN) .......................... 201810402299.1

(51) Int. Cl.
*H01L 51/00* (2006.01)
*H01L 51/52* (2006.01)

(52) U.S. Cl.
CPC ...... *H01L 51/0097* (2013.01); *H01L 51/5253* (2013.01)

(58) Field of Classification Search
CPC .................. H01L 51/0097; H01L 51/5253
See application file for complete search history.

(56) References Cited

U.S. PATENT DOCUMENTS

2005/0236985 A1   10/2005   Handa et al.
2016/0271914 A1*   9/2016   Xie ..................... H01L 51/0097

FOREIGN PATENT DOCUMENTS

| CN | 103299447 A | 9/2013 |
| CN | 104795403 A | 7/2015 |
| CN | 105206763 A | 12/2015 |
| CN | 105895823 A | 8/2016 |

(Continued)

*Primary Examiner* — Kyoung Lee
(74) *Attorney, Agent, or Firm* — Leong C. Lei

(57) ABSTRACT

Disclosed is a flexible cover plate of a display panel, comprising at least one stacking unit, wherein each stacking unit comprises a composite layer and an organic layer at a bottom of the composite layer, and the composite layer comprises at least one bendable first portion and second portions at two ends of the first portion. The flexible cover plate of the present invention possesses a composite layer and an organic layer which are stacked, and the composite layer has a bendable first portion, and the second portions at two ends of the first portion can be bent relative to the first portion in the middle. Therefore, the entire flexible cover plate possesses good bending performance, and meanwhile, the water resisting performance of the flexible cover plate is also ensured.

18 Claims, 4 Drawing Sheets

(56) References Cited

FOREIGN PATENT DOCUMENTS

| CN | 105938873 A | 9/2016 |
| CN | 106338852 A | 1/2017 |
| CN | 107248550 A | 10/2017 |
| CN | 107482127 A | 12/2017 |

* cited by examiner

FLEXIBLE COVER PLATE OF DISPLAY PANEL

RELATED APPLICATIONS

The present application is a National Phase of International Application Number PCT/CN2018/092221, filed Jun. 21, 2018, and claims the priority of China Application No. 201810402299.1, filed Apr. 28, 2018.

FIELD OF THE INVENTION

The present invention relates to a flexible display field, and more particularly to a flexible cover plate of a display panel.

BACKGROUND OF THE INVENTION

The conventional display cover materials are mostly made of rigid glass or resin (such as PMMA, i.e. polymethacrylate) combined with functional layers. The glass display cover is not bendable and does not conform to the development trend of the foldable display device. Although the resin can be bent, the water resistance thereof is not good, and the water vapor easily penetrates the cover plate into the device, eventually leading to the black spot and failure of an OLED (Organic Light Emitting Display).

SUMMARY OF THE INVENTION

In view of the deficiencies of the prior art, the present invention provides a flexible cover plate for a display panel, which can achieve both flexible bending performance and water resisting performance, and is suitable for various flexible display devices.

For realizing the aforesaid objective, the present invention provides the following technical solutions:

A flexible cover plate of a display panel, comprising at least one stacking unit, wherein each stacking unit comprises a composite layer and an organic layer at a bottom of the composite layer, and the composite layer comprising at least one first portion and second portions connected to two ends of the first portion.

As one of the embodiments, a hardness of the second portion is higher than a hardness of the first portion.

As one of the embodiments, a surface of the composite layer of the stacking unit located at an outermost layer of the flexible cover plate is further covered with an organic layer.

As one of the embodiments, the flexible cover plate of the display panel further comprises a transparent hardened layer covering a light exiting surface of the flexible cover plate.

As one of the embodiments, a plurality of stacked units is stacked, and widths of the first portions of at least two composite layers are different.

As one of the embodiments, the widths of the first portions of the corresponding composite layers gradually increase in a bending direction of the first portions.

As one of the embodiments, an outer surface of the first portion after bending is a curved surface, and as closer to a curvature center of the first portions, the width of the first portion of the corresponding composite layer is smaller.

As one of the embodiments, the width of the first portion of the composite layer in a middle layer of the flexible cover plate is the smallest, and as the composite layer is farther away from the middle layer, the width of the first portion of the composite layer is larger.

As one of the embodiments, the first portion comprises a plurality of through holes which are spaced apart, and each of the through holes is filled with a same material of the second portion.

As one of the embodiments, the organic layer and the first portion are both made of an organic material, and the second portion is made of an inorganic material.

The flexible cover plate of the present invention possesses a composite layer and an organic layer which are stacked, and the composite layer has a bendable first portion, and the second portions at two ends of the first portion can be bent relative to the first portion in the middle. Therefore, the entire flexible cover plate possesses good bending performance, and meanwhile, the water resisting performance of the flexible cover plate is also ensured.

DETAILED DESCRIPTION OF PREFERRED EMBODIMENTS

Figure 1:
FIG. 1 is a schematic structural view diagram of an organic light emitting diode (OLED) panel of the present invention.

In the present invention, the terms "arranged" and "disposed" should be understood broadly. For example, two objects may be indirectly connected or covered, or two objects may be in direct contact or fit. To those of ordinary skill in the art, the specific meaning of the above terminology in the present invention can be understood in the specific circumstances.

In addition, the orientations or positional relationships of the terms "upper", "lower", "top", "bottom", "inner", "outer", "middle", "vertical", "horizontal", etc. are based on the orientation or positional relationship shown in the drawings. These terms are primarily intended to better describe the present invention and its embodiments and are not used to define the indicated device. The element or component must have a particular orientation, or be constructed and operated in a particular direction.

Moreover, the above partial terms may be used to indicate other meanings in addition to the orientation or positional relationship, for example, the term "upper" may also be used to indicate a certain dependency or connection relationship in some cases. To those of ordinary skill in the art, the specific meaning of the above terminology in the present invention can be understood in the specific circumstances.

For the purpose, technical solutions and advantages of the present invention will become clear and unambiguous, the embodiment of the present invention is described in further detail below with reference to the accompanying drawings, simultaneously. It should be noted that the specific embodiments described herein are merely for explaining the present invention and are not intended to limit the present invention.

The flexible cover plate of the embodiment of the present invention can be used for various flexible display panels. Referring to FIG. 1, the flexible cover plate 1 of the present embodiment is applied to an organic light emitting diode (OLED) panel, and the OLED panel P includes a flexible bottom PI (Polyimide) substrate 2, a LTPS (Low Temperature Poly-silicon) layer 3 formed on the PI substrate 2, an organic light emitting layer 4 provided on the LTPS layer 3, an encapsulation layer 5 encapsulated on the surface of the organic light emitting layer 4, a polarizer 6 and a flexible touch screen 7. The flexible cover plate 1 covers the surface of the touch screen 7. In some embodiments, the touch screen 7 can be omitted. The flexible cover plate 1 serves as a cover plate layer of an OLED panel, which possesses functions of protecting the panel, waterproofing and dust-proof, and can also be bent as needed to achieve various display or appearance effects.

Specifically, the flexible cover plate comprises at least one stacking unit. Each stacking unit comprises a composite layer and a bendable organic layer at a bottom of the composite layer. Each of the composite layers comprises at least one first portion and second portions connected to two ends of the first portion. The organic layer and the first portion in a middle layer of the composite layer possess better flexibility, and can be easily bent. The second portion of the composite layer has a greater hardness than that of the first portion, and is not easy to bend, and possesses a strong water resisting capability. After the first portion is bent, two ends of the second portion can maintain a better flatness. Either of the composite layer and the organic layer may comprise a plurality of layers, and the organic layer and the composite layer are alternately stacked in a thickness direction of the flexible cover plate, thereby ensuring good bending performance, and also ensuring good water resisting performance and the flatness of the non-bent portion to improve the overall performance of the flexible cover plate.

Embodiment 1

Figure 2:
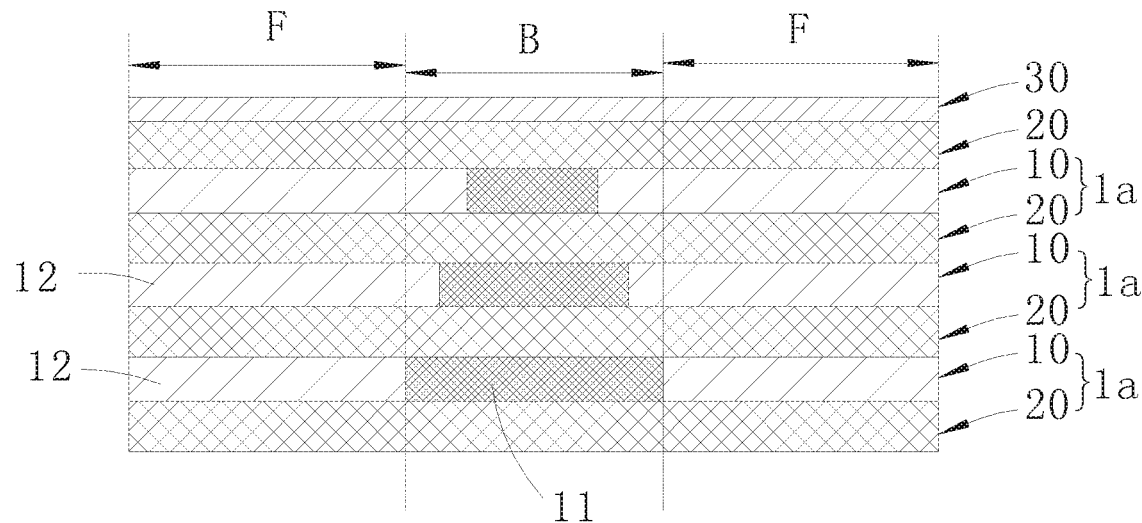
FIG. 2 is a schematic view diagram of a stacking structure of a flexible cover plate according to the first embodiment of the present invention.

As shown in FIG. 2, the flexible cover plate 1 of the present embodiment comprises at least one stacking unit 1a. Each stacking unit comprises a composite layer 10, a bendable organic layer 20 disposed at a bottom of the composite layer 10 and a transparent hardened layer 30 covering a uppermost part (light exiting surface) of the flexible cover 1. The transparent hardened layer 30 may be made of a transparent inorganic material, such as an inorganic material including siloxane (silicone), which can maintain the physical properties in an abnormally wide temperature range (−100 degrees Celsius to 250 degrees Celsius), to form a protection material having high temperature resistance, oxidation resistance, stability, good water repellency and good dielectric property. Each of the composite layers 10 is substantially identical in composition and includes a first portion 11 in the middle and second portions 12 at two ends of the first portion 11. The first portion 11 in the middle can be bent at will, and the second portions 12 at the two ends are harder than the first portion 11, which are not easily bent, possess a strong water resisting capability, and the organic layer 20 can be made of the same material as the first portion 11.

According to the zone division, the flexible cover plate 1 can be divided into a bendable zone B and non-bending zones F which are not easily bent at the two ends of the bendable zone B. In order to ensure that the bendable zone B of the flexible cover plate possesses a better flexibility, and the non-bending zones F possess a better rigidity, and either of the composite layer 10 and the organic layer 20 comprises a plurality of layers, and the organic layer 20 and the composite layer 10 are alternately stacked in the thickness direction of the flexible cover plate 1. A maximum width of a projection of each of the first portions 11 is the width of the bendable zone B.

Here, the organic layer 20 and the first portion 11 are both made of an organic material, and the second portion 12 is made of an inorganic material. As one of the embodiments, the organic layer 20 and the first portion 11 are made of a transparent resin, and a material of the organic layer 20 or the first portion 11 may be selected from colorless polyimide, polyurethane (PU), polyethylene terephthalate (PET) or polyethylene naphthalate (PEN). The second portion 12 is made of a transparent ceramic material selected from $SiO_2$, SiN, SiON or $Al_2O_3$. For preparation, the organic layer 20 and/or the first portion 11 may be deposited on the substrate by inkjet printing, and the second portion 12 may be deposited on the substrate by plasma enhanced chemical vapor deposition (PECVD) or atomic layer deposition (ALD).

Figure 3:
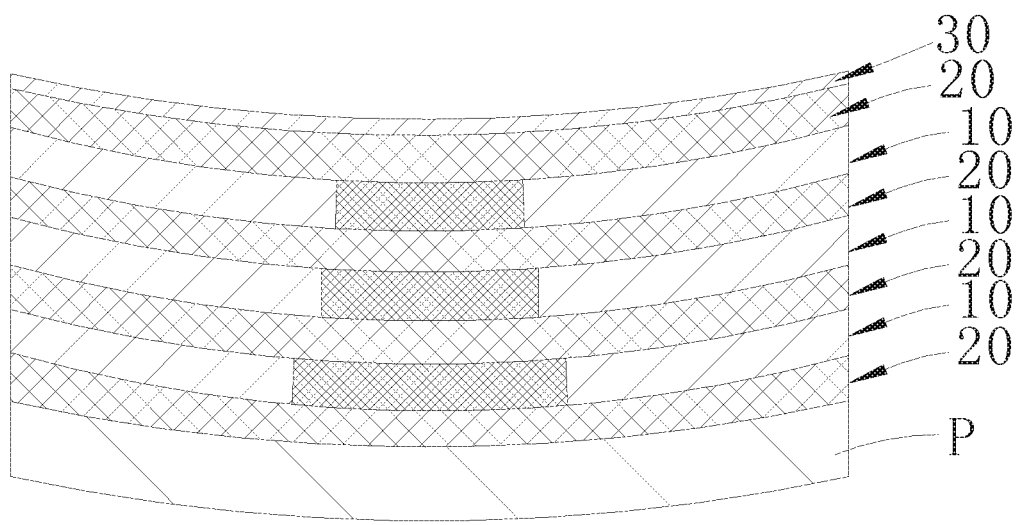
FIG. 3 is a schematic view diagram of a bent state of a flexible cover plate according to the first embodiment of the present invention.

The number of the stacking units 1a is not limited and can be freely selected according to actual needs. In this embodiment, the multi-layer stacking units 1a are stacked on the surface of the touch screen 7, and the surface of the composite layer 10 of the stacking unit 1a at the outermost layer of the flexible cover plate is further covered with an organic layer 20, and the hardened layer 30 is covered on the surface of the outermost organic layer 20. Namely, the specific layer numbers of the composite layers 10 and the organic layers 20 are not limited, and the two only need to be alternately arranged. The flexible cover plate 1 has an organic layer 20 for bonding to the inner side of the hardened layer 30 and has another organic layer 20 at the inner side for bonding to the OLED panel P to provide a protective effect to the composite layer 10 in the middle. As shown in FIG. 3, after the flexible cover plate 1 of the present embodiment is bent, the flexible cover plate 1 is bent toward the OLED panel P to form a concave display surface, that is, the flexible cover plate 1 is tilted at two ends and is recessed at the center. The hardened layer 30 on the side of the light exiting surface is a concave curved surface structure, and the middle zone of the hardened layer 30 is a bent portion right opposite to the first portions 11 of the respective composite layers 10, and the edge zone of the hardened layer 30 is a flat portion connected to the bent portion.

Since in such curved flexible cover plate 1, the stress acted to the flexible cover plate 1 is larger as getting closer to the OLED panel P, and particularly the stress acted to the middle zone of the flexible cover plate 1. Thus, in this embodiment, the difference among the composite layers 10 in the respective stacking units 1a is that widths of the first portions 11 of at least two composite layers 10 are different. Further, as closer to the hardened layer 30, the width of the first portion 11 in the composite layers 10 is smaller. Namely, as closer to the OLED panel P, the width of the first portion 11 in the composite layers 10 is larger, and the stress on the bendable zone B as being bent can be alleviated. The second portion 12 of the composite layer 10 near the bendable zone B can be prevented from being broken, thereby ensuring that the breakage of the flexible cover plate 1 does not appear during the bending process to possess both excellent flexibility and water resistance.

In other embodiments, the bent portion of the hardened layer 30 after bending can also be designed as a smooth curved surface, and the concave direction of the curved surface is consistent with the bending direction thereof. As closer to the curvature center of the bent portion, the width of the first portion 11 of the corresponding composite layer 10 is smaller since the hardened layer 30, the organic layer 20 adjacent thereto and the respective stacking units 1a are constantly in the adhesion state, and the first portions 11 and the bent portion of the hardened layer 30 are consistent in shape.

As preparing the flexible cover plate 1 of the present embodiment, a substrate is first provided, and then the organic layer 20 and the composite layer 10 are alternately deposited in a longitudinal direction of the substrate, and finally, the hardened layer 30 is covered on the surface of the topmost organic layer 20, and then the substrate at the bottom is removed. The organic layer 20 is formed by depositing an organic material by inkjet printing or the like, and the composite layer 10 is formed by depositing an organic material by inkjet printing or the like on a portion corresponding to the bendable zone B on the surface of the organic layer 20 to form the first portion 11, and the second portion 12 is formed by depositing an inorganic material, such as PECVD or ALD on a portion of the surface of the organic layer 20 corresponding to a zone outside the bendable zone B. After depositing the bottommost organic layer 20 on the substrate, a second portion 12 having a hollow pattern is deposited on the surface of the bottommost organic layer 20, and then, the organic material is filled in the hollow pattern of the second portion 12 to form the first portion 11, and then, an organic layer 20 is deposited on the surface of the second portion 12 and the first portion 11. With such repeatedly deposition and finally, an organic layer 20 is deposited on the outermost layer, and the hardened layer 30 is covered. When the first portion 11 and the organic layer 20 are made of the same material, the first portion 11 and the organic layer 20 can be formed at one time, that is, after the second portion 12 having the hollow pattern is formed, a layer of organic material is deposited directly on the surface of the second portion 12, and the is filled simultaneously with the hollow pattern zone of the second portion 12, and an organic layer 20 is formed on the surface of the second portion 12, which simplifies the manufacturing process and makes the bonding strength between the layers more reliable.

The first portions 11 disposed above and below are stacked, and as the composite layer 10 is in the upper layer, the width of the first portion 11 is smaller and the width of the second portion 12 is larger. After the bottommost substrate is removed, a downward bending force can be applied in the bendable zone B to bend the bendable zone B, thereby forming a flexible cover plate 1 which is tilted at two ends and recessed in the middle.

Embodiment 2

Figure 4:
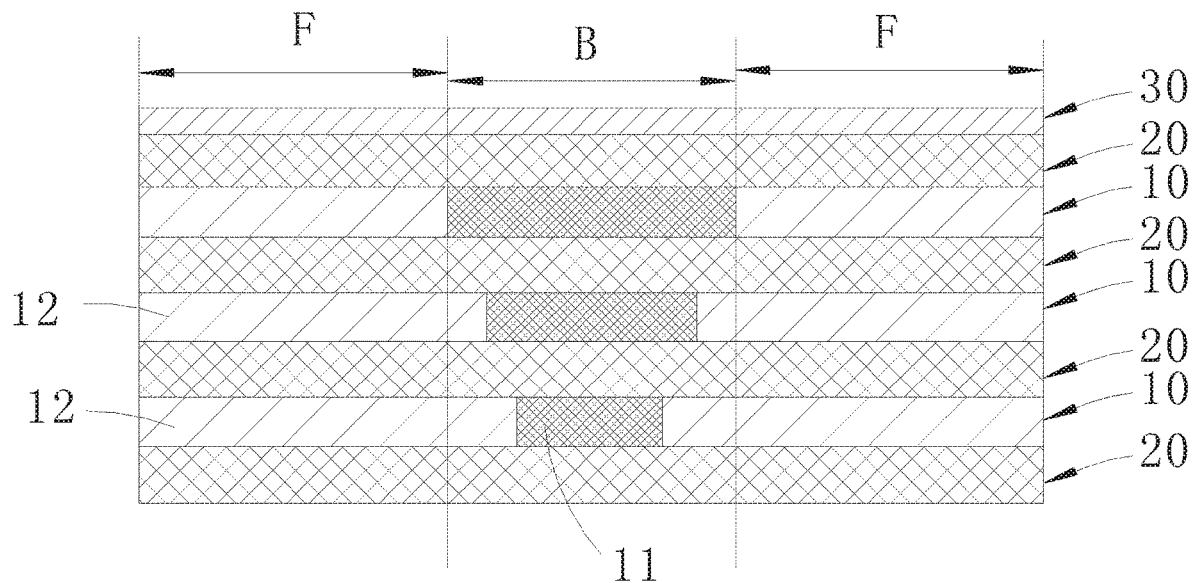
FIG. 4 is a schematic view diagram of a stacking structure of a flexible cover plate according to the second embodiment of the present invention.
Figure 5:
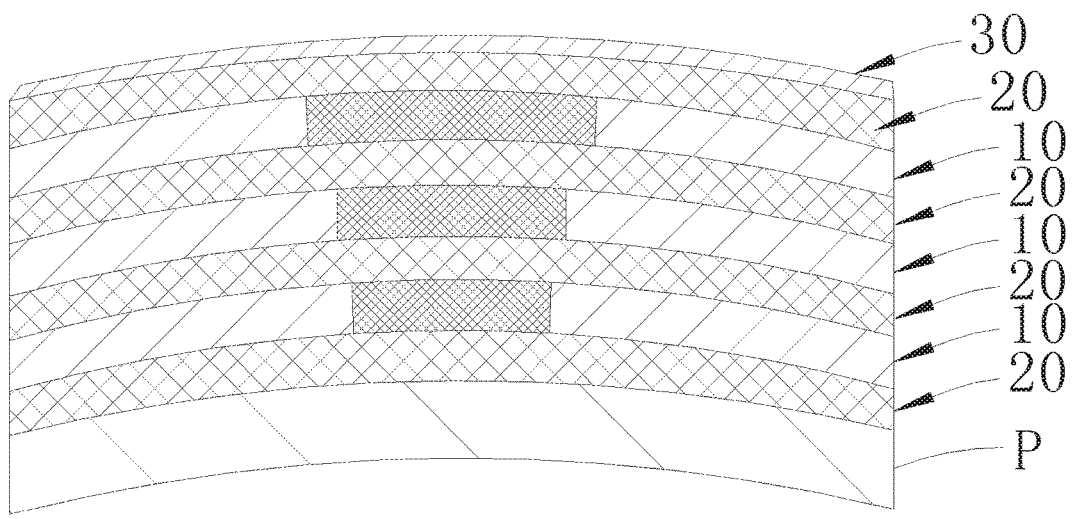
FIG. 5 is a schematic view diagram of a bent state of a flexible cover plate according to the second embodiment of the present invention.

As shown in FIG. 4 and FIG. 5, the difference from the embodiment 1 is that the flexible cover plate 1 is bent away from the OLED panel P to form a convex display surface. The hardened layer 30 on the side of the light exiting surface is a convex curved surface structure, and the middle zone of the hardened layer 30 is a bent portion right opposite to the first portions 11 of the respective composite layers 10, and the edge zone of the hardened layer 30 is a flat portion connected to the bent portion.

Since in such curved flexible cover plate 1, the stress acted to the flexible cover plate 1 is larger as getting farther to the OLED panel P, and particularly the stress acted to the middle zone of the flexible cover plate 1. Thus, in this embodiment, as farther to the hardened layer 30, the width of the first portion 11 in the composite layers 10 is larger. The stress on the bendable zone B as being bent can be alleviated. The second portion 12 of the composite layer 10 near the bendable zone B can be prevented from being broken.

In other embodiments, the bent portion of the hardened layer 30 after bending may also be designed as a smooth curved surface, and the convex surface direction of the curved surface is consistent with the bending direction thereof, and as closer to the curvature center of the bent portion, the width of the first portion 11 of the corresponding composite layer 10 is smaller.

The difference from embodiment 1 is that in the flexible cover plate 1 of this embodiment, as the composite layer 10 is in the upper layer, the width of the first portion 11 is larger and the width of the second portion 12 is smaller. After the bottommost substrate is removed, a downward bending force can be applied in the bendable zone B to bend the bendable zone B upward, thereby forming a flexible cover plate 1 which is arched in the middle and drooping at two ends.

Embodiment 3

Figure 6:
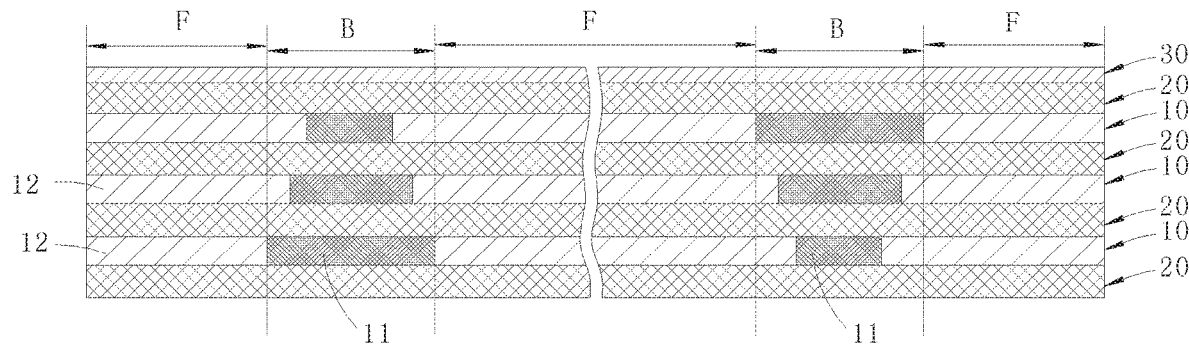
FIG. 6 is a schematic view diagram of a stacking structure of a flexible cover plate according to the third embodiment of the present invention.
Figure 7:
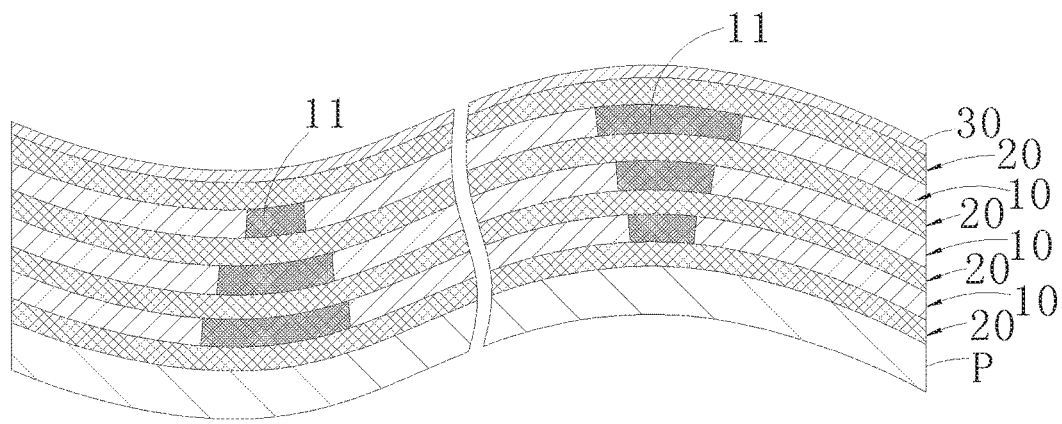
FIG. 7 is a schematic view diagram of a bent state of a flexible cover plate according to the third embodiment of the present invention.
Figure 8:
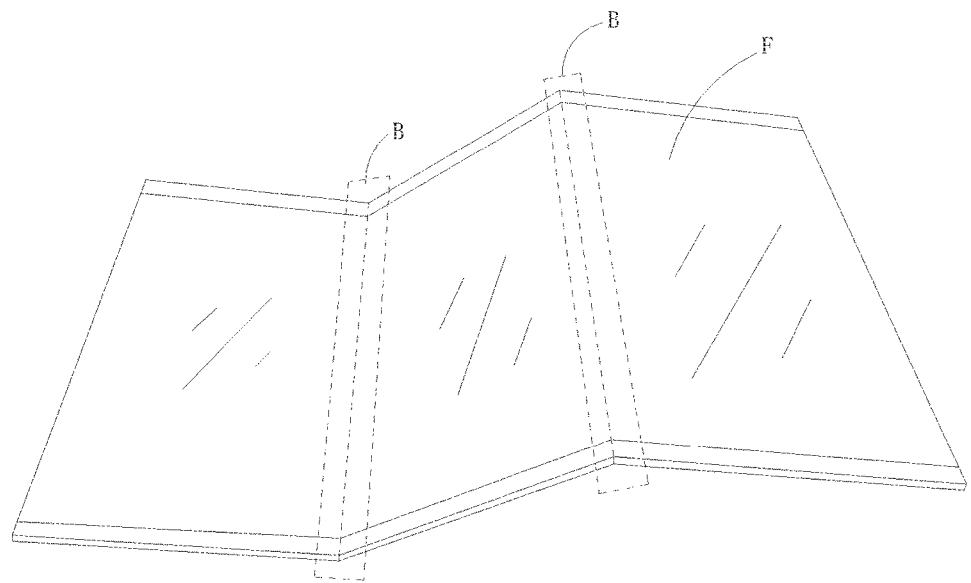
FIG. 8 is a perspective view diagram of a bent result of a flexible cover plate according to the third embodiment of the present invention.

As shown in FIGS. 6 to 8, the difference from the aforesaid embodiments is that the flexible cover plate 1 of the present embodiment can be bent at multiple positions, and comprises a plurality of non-bending zones F and bendable zones B between two non-bending zones F. Correspondingly, each of the composite layers 10 comprises a plurality of second portions 12 and the first portions 11 connected between the two second portions 12, and the hardened layer 30 comprises a plurality of bent portions right opposite to the first portions 11 of the composite layers 10.

This embodiment shows a case where the flexible cover plate 1 has two bendable zones B, and the bending directions of the two bendable zones B are opposite to facilitate proper folding and unfolding of the display device. Correspondingly, the hardened layer 30 has two bent portions respectively opposite to the first portions 11 of the respective composite layers 10. One of the bendable zones B of the flexible cover plate 1 is bent as described in the first embodiment, and the bent portion of the layer 30 is a concave curved surface structure. In the bendable zone B, as closer to the OLED panel P, the width of the first portion 11 in the composite layer 10 is larger, and the stress acted on the bendable zone B as being bent can be alleviated; the other bendable zones B is bent as described in the second embodiment, and the bent portion of the layer 30 is a concave curved surface structure. In the bendable zone B, as closer to the hardened layer 30, the width of the first portion 11 in the composite layer 10 is larger, and the stress acted on the bendable zone B as being bent can be alleviated.

It can be understood that the embodiment does not limit the bending number of the flexible cover plate. In practical applications, the number of the flexible cover plate can be designed as needed.

As preparing the flexible cover plate 1 of the present embodiment, a substrate is first provided, and then the organic layer 20 and the composite layer 10 are alternately deposited in a longitudinal direction of the substrate, and finally, the hardened layer 30 is covered on the surface of the topmost organic layer 20, and then the substrate at the bottom is removed. The organic layers 20 is formed by depositing an organic material by inkjet printing or the like, and the composite layer 10 is formed by depositing an organic material by inkjet printing or the like on a portion corresponding to the respective bendable zones B on the surface of the organic layer 20 to form the first portions 11, and the second portions 12 are formed by depositing an inorganic material, such as PECVD or ALD on a portion of the surface of the organic layer 20 corresponding to the rest zones. The first portions 11 disposed above and below are stacked. In one bendable zone B, as the composite layer 10 is in the upper layer, the width of the first portion 11 is smaller. In a bendable zone B adjacent to the above bendable zone B, as the composite layer 10 is in the upper layer, the width of the first portion 11 is larger. Namely, in the longitudinal direction, the widths of the first portions 11 in the respective composite layers 10 change in an opposite direction. After the bottommost substrate is removed, the bending force can be applied to the bendable zones B in a direction in which the width of the first portion 11 becomes larger, so that the bendable zones B can be bent in the corresponding directions, thereby forming the flexible cover plate 1 which is bent at multiple positions.

Embodiment 4

Figure 9:
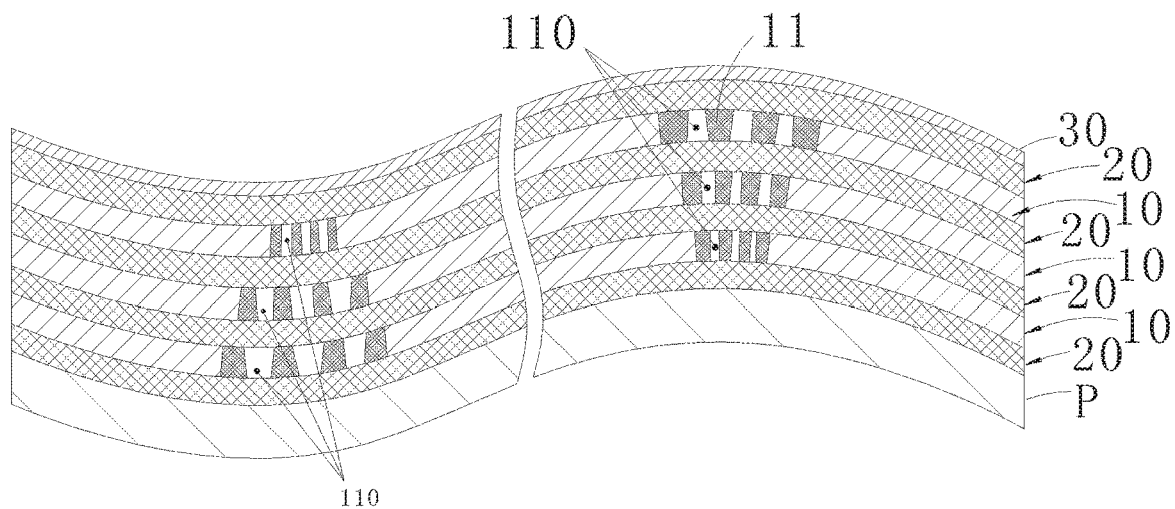
FIG. 9 is a schematic view diagram of a bent state of a flexible cover plate according to the fourth embodiment of the present invention.

As shown in FIG. 9, each of the first portions 11 in this embodiment comprises a plurality of through holes 110 which are spaced apart in a width direction, and each of the through holes 110 is filled with a same material of the second portion 12. When the flexible cover plate is bent in the bendable region B, the first portion 11 is correspondingly bent. Since the first portion 11 is filled with the same material as the second portion 12 at intervals, the difference in refractive indexes of the bendable zone B and the non-bending zone F can be reduced, thereby reducing the difference in the display results of the bendable region B and the non-bending zone F.

As preparing the flexible cover plate 1 of the present embodiment, the difference from embodiment 4 is only the process of each composite layer 10. When the composite layers 10 are formed, a patterned inorganic material layer having a plurality of through holes 110 may be first deposited on the surface of the organic layer 20, and then an organic material layer is deposited on the surface of the inorganic material layer. The organic material layer completely covers the underlying inorganic material layer and is filled in the through holes 110 of the inorganic material layer. Thus, the first portion 11 of the composite layer 10 and the upper organic layer 20 can be formed at one time, and then the next organic layer 20 is deposited on the surface of the composite layer 10.

Embodiment 5

Figure 10:
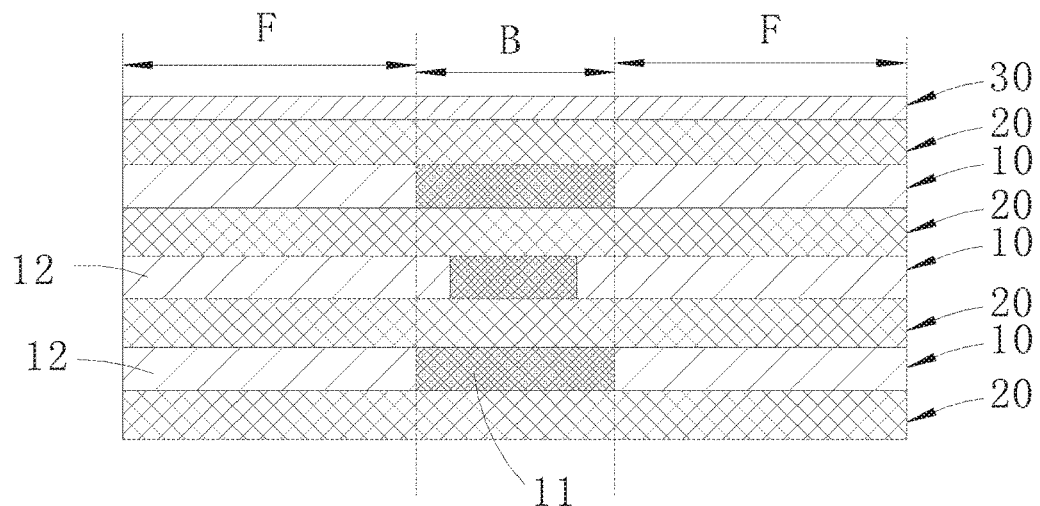
FIG. 10 is a schematic view diagram of a stacking structure of a flexible cover plate according to the fifth embodiment of the present invention.
Figure 11:
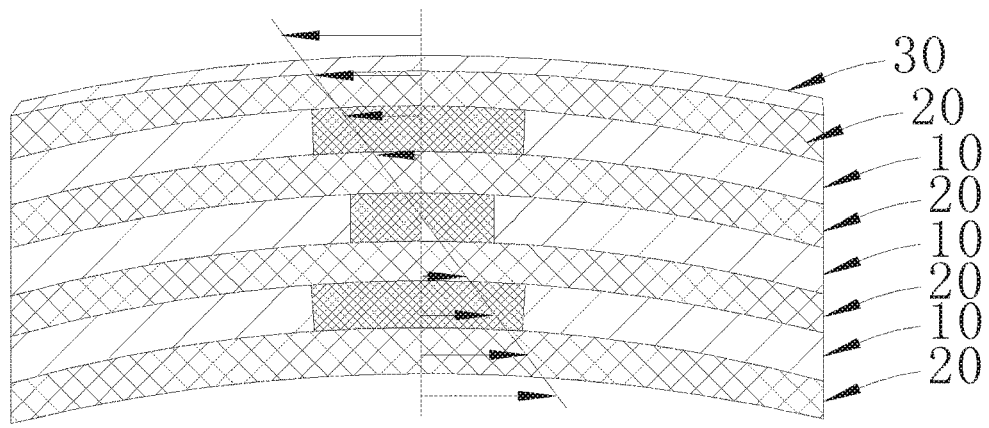
FIG. 11 is a schematic view diagram of a bent state of a flexible cover plate according to the fifth embodiment of the present invention.

As shown in FIG. 10 and FIG. 11, the difference from Embodiment 1 and Embodiment 2 is that in the flexible cover plate 1 of this embodiment, the width of the first portion 11 of the composite layer in the middle layer is the smallest, and as farther away from the composite layer in the middle layer, the width of the first portion 11 of the composite layer is larger. The end faces of the composite layers 10 and the organic layers 20 are aligned, and the first portion 11 in the middle of the composite layer 10 is symmetrically disposed about the symmetric center of the composite layer 10. The first portion 11 in the middle of each of the composite layers 10 can be bent, and the second portion 12 is difficult to bend, and the widths of the first portions 11 of the composite layers 10 at the uppermost and lowermost layers are the largest, and a maximum width of a projection of each of the first portions 11 is the width of the bendable zone B. The non-bending zone F is located outside the bendable zone B.

As shown in FIG. 11, at the time of design, in combination with the thickness and elastic modulus of the composite layer 10 and the organic layer 20, the neutral axis is disposed in the composite layers 10 at the middle layer. As being bent, as farther from the neutral axis, the strain of the layer is larger. According to the stress formula $\sigma=E\varepsilon$, where $\sigma$ represents stress, E represents elastic modulus, and $\varepsilon$ represents strain. It can be seen that as the strain is the same, the elastic modulus of the material is greater, and the stress acted on the material is larger, and the risk of material damage is correspondingly higher. The elastic modulus of the inorganic composite layer 10 is greater than that of the organic layer 20. In the large strain zones away from the neutral axis, it is easier to reduce the risk of damage to the cover plate by using an organic layer with a smaller elastic modulus. Therefore, as the width of the first portion 11 of the composite layer 10 in which the neutral axis is located is smaller and the width of the first portion 11 of the composite layer 10 farther away from the neutral axis is larger, it is more advantageous for the bending of the cover plate.

The bendable zone B of the flexible cover plate 1 of the present embodiment can be bent toward the OLED panel, or can be bent away from the OLED panel. The flexible cover plate 1 can still maintain good flexibility. Such a bendable zone B can also be combined with the bending manner of Embodiment 1 or Embodiment 2 while being present in the same flexible cover plate 1.

The flexible cover plate of the present invention possesses a composite layer and an organic layer which are stacked, and the composite layer has a bendable first portion, and the second portions at two ends of the first portion can be bent relative to the first portion in the middle. The organic layer and the composite layer are alternately stacked in the thickness direction of the flexible cover plate, so that the entire flexible cover plate possesses good bending performance, and meanwhile, the water resisting performance of the flexible cover plate is also ensured.

Above are only specific embodiments of the present application, the scope of the present application is not limited to this, and to any persons who are skilled in the art, change or replacement which is easily derived should be covered by the protected scope of the application. Thus, the protected scope of the application should go by the subject claims.

What is claimed is:

1. A flexible cover plate of a display panel, comprising at least one stacking unit, wherein each stacking unit comprises a composite layer and an organic layer at a bottom of the composite layer, and the composite layer comprising at least one first portion and second portions connected to two ends of the first portion, wherein a hardness of the second portion is higher than a hardness of the first portion, and wherein a surface of the composite layer of the stacking unit located at an outermost layer of the flexible cover plate is further covered with an organic layer.

2. The flexible cover plate of the display panel according to claim 1, further comprising a transparent hardened layer covering a light exiting surface of the flexible cover plate.

3. The flexible cover plate of the display panel according to claim 1, wherein a plurality of stacked units are stacked, and widths of the first portions of at least two composite layers are different.

4. The flexible cover plate of the display panel according to claim 3, wherein the widths of the first portions of the corresponding composite layers gradually increase in a bending direction of the first portions.

5. The flexible cover plate of the display panel according to claim 4, wherein an outer surface of the first portion after bending is a curved surface, and as closer to a curvature center of the first portions, the width of the first portion of the corresponding composite layer is smaller.

6. The flexible cover plate of the display panel according to claim 3, wherein the width of the first portion of the composite layer in a middle layer of the flexible cover plate is the smallest, and as the composite layer is farther away from the middle layer, the width of the first portion of the composite layer is larger.

7. The flexible cover plate of the display panel according to claim 1, wherein the first portion comprises a plurality of through holes which are spaced apart, and each of the through holes is filled with a same material of the second portion.

8. The flexible cover plate of the display panel according to claim 7, wherein the organic layer and the first portion are both made of an organic material, and the second portion is made of an inorganic material.

9. The flexible cover plate of the display panel according to claim 1, wherein the first portion comprises a plurality of through holes which are spaced apart, and each of the through holes is filled with a same material of the second portion.

10. The flexible cover plate of the display panel according to claim 9, wherein the organic layer and the first portion are both made of an organic material, and the second portion is made of an inorganic material.

11. The flexible cover plate of the display panel according to claim 1, wherein the first portion comprises a plurality of through holes which are spaced apart, and each of the through holes is filled with a same material of the second portion.

12. The flexible cover plate of the display panel according to claim 11, wherein the organic layer and the first portion are both made of an organic material, and the second portion is made of an inorganic material.

13. The flexible cover plate of the display panel according to claim 3, wherein the first portion comprises a plurality of through holes which are spaced apart, and each of the through holes is filled with a same material of the second portion.

14. The flexible cover plate of the display panel according to claim 13, wherein the organic layer and the first portion are both made of an organic material, and the second portion is made of an inorganic material.

15. The flexible cover plate of the display panel according to claim 4, wherein the first portion comprises a plurality of through holes which are spaced apart, and each of the through holes is filled with a same material of the second portion.

16. The flexible cover plate of the display panel according to claim 15, wherein the organic layer and the first portion are both made of an organic material, and the second portion is made of an inorganic material.

17. The flexible cover plate of the display panel according to claim 5, wherein the first portion comprises a plurality of through holes which are spaced apart, and each of the through holes is filled with a same material of the second portion; the organic layer and the first portion are both made of an organic material, and the second portion is made of an inorganic material.

18. The flexible cover plate of the display panel according to claim 6, wherein the first portion comprises a plurality of through holes which are spaced apart, and each of the through holes is filled with a same material of the second portion; the organic layer and the first portion are both made of an organic material, and the second portion is made of an inorganic material.

* * * * *